US006788433B1

(12) United States Patent
Ichikawa et al.

(10) Patent No.: US 6,788,433 B1
(45) Date of Patent: Sep. 7, 2004

(54) CHARACTER INFORMATION PROCESSOR

(75) Inventors: Tomoyuki Ichikawa, Tokyo (JP); Kenichi Tanabe, Tokyo (JP); Kenji Watanabe, Tokyo (JP); Shinichi Tsukagoshi, Suwa (JP); Masahiko Nunokawa, Suwa (JP)

(73) Assignees: King Jim Co., Ltd. (JP); Seiko Epson Corporation (JP)

( * ) Notice: Subject to any disclaimer, the term of this patent is extended or adjusted under 35 U.S.C. 154(b) by 0 days.

(21) Appl. No.: 09/307,759

(22) Filed: May 10, 1999

(30) Foreign Application Priority Data

May 11, 1998 (JP) .......................................... 10-127033

(51) Int. Cl.[7] .......................... G06F 15/00; G06F 13/00

(52) U.S. Cl. ...................... 358/1.9; 358/1.11; 358/1.13; 358/1.18; 283/81; 101/401.1

(58) Field of Search ................................ 358/1.9, 1.13, 358/1.11, 1.18; 283/81; 705/60, 62, 401, 408; 101/401.1

(56) References Cited

U.S. PATENT DOCUMENTS

| 5,677,999 A | * | 10/1997 | Hidaka et al. ............. 358/1.18 |
| 5,748,239 A | * | 5/1998 | Klees .......................... 348/373 |
| 5,978,781 A | * | 11/1999 | Sansone ....................... 101/71 |
| 6,147,767 A | * | 11/2000 | Petteruti et al. ........... 358/1.18 |

FOREIGN PATENT DOCUMENTS

| JP | 5262024 | 10/1993 |
| JP | 5298464 | 11/1993 |
| JP | 6278350 | 10/1994 |
| JP | 7-271548 | 10/1995 |

* cited by examiner

Primary Examiner—Edward Coles
Assistant Examiner—Alan Rahimi
(74) Attorney, Agent, or Firm—Lorusso, Loud & Kelly

(57) ABSTRACT

In a character information processor adapted to print an input character string in accordance with a designated printing attribute on a print medium which is limited in at least one of the transversal or longitudinal directions, the type of currently loaded print medium is detected; a fixed phrase is selected by a user from a plurality of stored fixed phrases; and the selected fixed phrase is printed in accordance with a printing attribute determined by the detected type of the print medium and stored fixed phrase information.

2 Claims, 7 Drawing Sheets

FIG.5

| SEAL TYPE | IS SEAL TYPE FOR FIXED PHRASE ? | FIXED PHRASE TYPE PROVIDED |
|---|---|---|
| PRIVATE SEAL (SMALL SIZE) | N | — |
| PRIVATE SEAL | Y | GIFT WRAPPING PAPER, MAIL |
| RECTANGULAR SEAL (SMALL SIZE) | Y | GIFT WRAPPING PAPER, MAIL |
| RECTANGULAR SEAL (MEDIUM SIZE) | Y | GIFT WRAPPING PAPER, MAIL |
| ACCOUNTING SEAL | N | — |
| NAME SEAL | N | — |
| BUSINES SEAL (SMALL SIZE) | Y | GIFT WRAPPING PAPER, NEW YEAR, MAIL |
| BUSINES SEAL (LARGE SIZE) | Y | GIFT WRAPPING PAPER, NEW YEAR, MAIL |
| ADDRESS SEAL | Y | GIFT WRAPPING PAPER, NEW YEAR, MAIL |

Y · · · YES
N · · · NO

} FIRST DATA
} SECOND DATA
} THIRD DATA
} FOURTH DATA

FIRST DATA | SECOND DATA | THIRD DATA | FOURTH DATA

FIRST SECOND THIRD FOURTH
DATA  DATA   DATA  DATA

CHARACTER INFORMATION PROCESSOR

BACKGROUND OF THE INVENTION

1. Field of the Invention

The present invention relates to a character

The present invention relates to a character information processor having a function of printing an input character string (the term "character string" as used herein includes symbols, pictographs, and the like). The present invention particularly concerns a seal or stamp producing apparatus which forms an imprint pattern on different sizes and shapes of seal or stamp medium.

2. Discussion of Related Art

These days, seal producing apparatuses with which the user can readily make a seal have become prevalent in companies and homes. Such a seal producing apparatus has an input function similar to those of other types of information processors, such as personal computers, word processors, and the like.

Meanwhile, in the case where a seal is produced by using a seal producing apparatus, the imprint pattern to be engraved on the seal face of the seal often contains, as a part or all of the imprint pattern, a fixed phrase character string portion which is usually closely related to the use of the seal as well as an optional character string portion selected by the user. As examples of such an imprint pattern constituted by a combination of an arbitrarily input character string portion and a fixed phrase character string portion, "Suzuki's Personal Library" in the case of a seal used for personal library (i.e. personal books) (hereinafter, a seal used for personal library is often referred as "personal library seal") owned by a person named Suzuki, and "Catalogue Enclosed" in the case of a seal for showing that the envelope or box contains an enclosure (hereinafter, a seal used for showing that the envelope or box contains an enclosure will be often referred to as "enclosure seal").

In conventional seal producing apparatuses, an input method, "form input method" is employed, in addition to an ordinary input method. When the form input method is employed, producing a seal carrying such an imprint pattern containing a fixed phrase character string portion is facilitated to some extent.

This will be explained by way of an example case in which a private library seal having an impring pattern of "Suzuki's Personal Library", which is constituted by a combination of an optional character siring portion "Suzuki's" and a fixed phrase character string portion "Personal Library", is produced by using the form input method.

First, the user turns the input method from an ordinary input method to the "form input method", and selects "personal library" as an item of use of seal. In response to this operation conducted by the user, the apparatus displays a character input screen of "name [personal library]", in which the item "name" shows the optional character string portion and the item "personal library" embraced by the blankets shows fixed phrase character string portion. Under the form input method, the input of the entire character string is completed only by inputting his name "Suzuki" at the optional character string portion, that is, it is not necessary to input the fixed phrase character string portion "personal library". Also, the characters are automatically arranged by the apparatus so that the arrangement of the characters of the printed imprint pattern becomes well-balanced.

Note that, even where the form input method is employed, the fixed phrase character string portion "private seal" can be deleted. Further, different print attributes may be applied to the optional character string portion and the fixed phrase character string portion. For example, the fonts of the character string portions "Suzuki's" and "Personal Library" may be different from each other.

Meanwhile, among seals, there are some seals whose imprint pattern is composed of only a fixed phrase character string portion (hereinafter, a seal whose imprint pattern is composed of only a fixed phrase character string portion will often referred to as "fixed phrase seal"), and such fixed seals are already commercially available. Examples of such a fixed phrase seal include a seal having a character string of "親展" (meaning "confidential"), a seal having a character string of "書留" (meaning "registered mail"), and a seal having a character string of "速達" (meaning "special delivery"). It often happens that the user wishes to produce such a fixed phrase seal by using the seal producing apparatus.

However, if such a fixed phrase seal is intended to be produced by using the ordinary input method, although the fixed phrase character string portion and arrangement of the characters in the character string are fixedly determined, the entire character string and the printing attributes of the character string must be input every time the fixed phrase seal is intended to be produced. Thus, inputting operations become considerably complicated, so that the usability of the apparatus is greatly lowered.

In contrast, when the form input method is employed in producing the fixed phrase seal, it is advantageous over the ordinary input method in that input of a part or all of the character string can omitted. However, in the form input method, it is allowed to change the characters and printing attributes, so that the user is liable to mistakenly perform such operations, so that he is liable to fail to obtain his desired character string. Further, the form input method cannot be applied to a fixed phrase seal of the type in which a special enclosing pattern is included as a part of the imprint pattern, such as a "速達" seal (see FIG. 11B), or of the type in which a special font is used, such as a "z,4 " (meaning "NewYear's Gift") seal (see FIG. 8A).

A possible option to solve these problems is to provide special fonts used only for the character data of the fixed phrase, that is, fonts which are not usually used for ordinary seals but needed for fixed phrase seals. However, in order that such special fonts can be used in ordinary input operations, such special fonts must be stored in the apparatus with respect to several thousands of characters. Thus, the efficiency of the input operations are greatly lowered, so that this option cannot be adopted.

Note that the above-mentioned problems also happen when producing a label having a fixed phrase character string printed thereon, such as "親展", "書留", "速達", etc.

Under the above circumstances, a character information processor with which the user can readily produce a fixed phrase seal or a fixed phrase label on which a fixed phrase is engraved or printed.

SUMMARY OF THE INVENTION

It is therefore an object of the present invention to provide a character information processor with which the user can readily produce a fixed phrase seal or a fixed phrase label on which a fixed phrase is engraved or printed.

To achieve the above object, the present invention provides a character information processor which is adapted to print an input character string in accordance with a designated printing attribute on a print medium in which limitation is imposed on at least one of the transversal or longitudinal directions, said character information processor including: (1) print medium detecting means for detecting a type of print medium which is currently loaded in said character information processor; (2) fixed phrase information storing means for storing information used for printing a fixed phrase designated out of a plurality of fixed phrases; (3) fixed phrase selecting means for causing the user to designate the fixed phrase to be printed; and (3) printing means for printing, on the print medium currently loaded in said character information processor, the fixed phrase thus designated in accordance with a printing attribute determined by the type of the print medium detected by the print medium type detecting means and the information stored in the fixed phrase information storage means.

BRIEF DESCRIPTION OF THE DRAWINGS

Other features, objects and advantages of the present invention will become apparent from the following description of the preferred embodiments with reference to the drawings in which like reference characters designate like or corresponding parts throughout several views, and in which:

FIG. 5 is an explanatory view showing a relationship between seal types and fixed phrases in a seal producing apparatus according to an embodiment of the present invention;

FIGS. 6A to 6C are explanatory views each showing an example of a one-data type fixed phrase in a seal producing apparatus according to an embodiment of the present invention;

FIGS. 7A to 7C are explanatory views each showing an example of a two-data type fixed phrase in a seal producing apparatus according to an embodiment of the present invention;

DETAILED DESCRIPTION OF THE INVENTION

Hereinafter, an embodiment of a seal producing apparatus according to the present invention will be described with reference to the attached drawings.

(A) Constitution of the Embodiment

Figure 2:
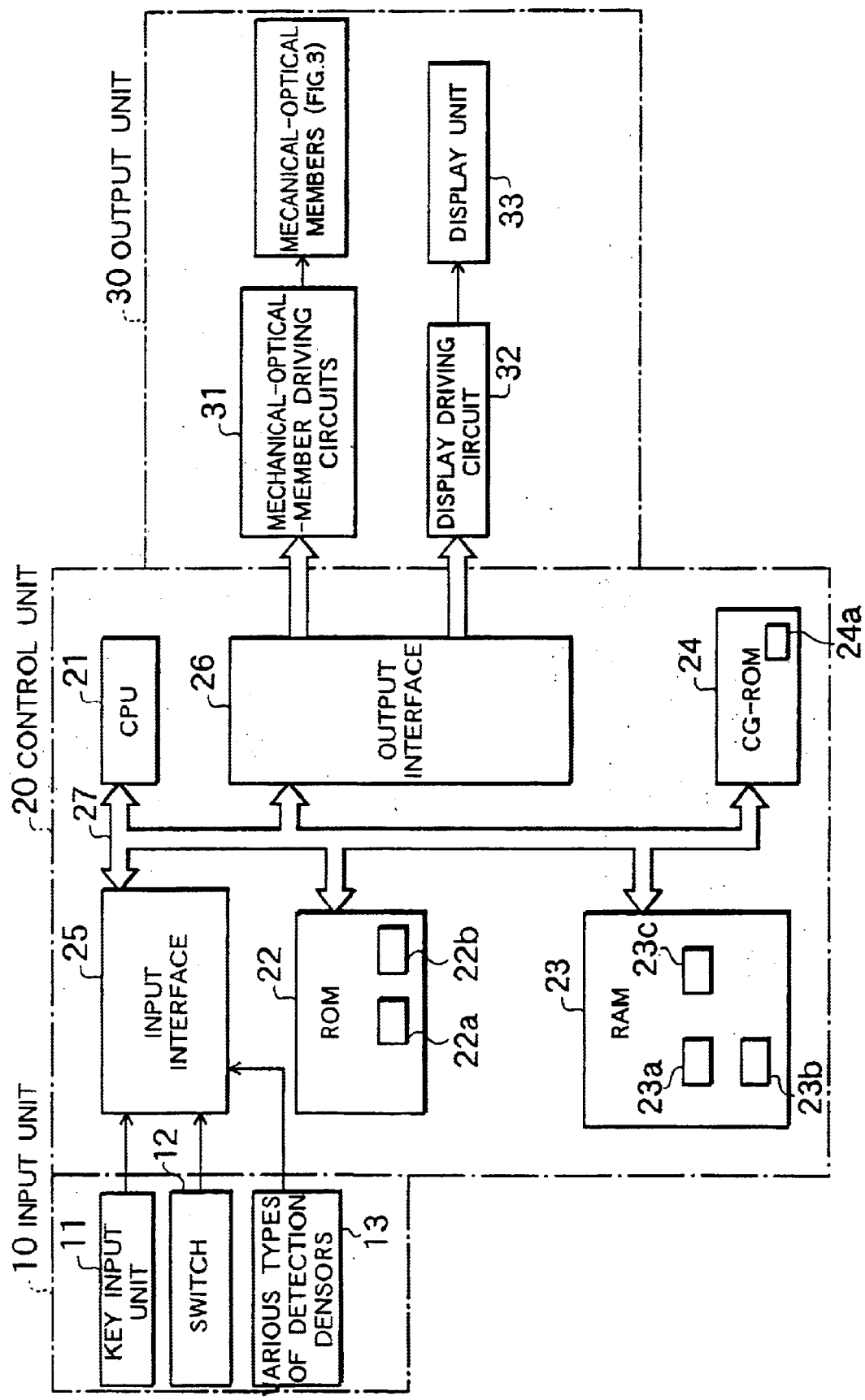
FIG. 2 is a block diagram showing configuration of electrical members in a seal producing apparatus according to an embodiment of the present invention.
Figure 3:
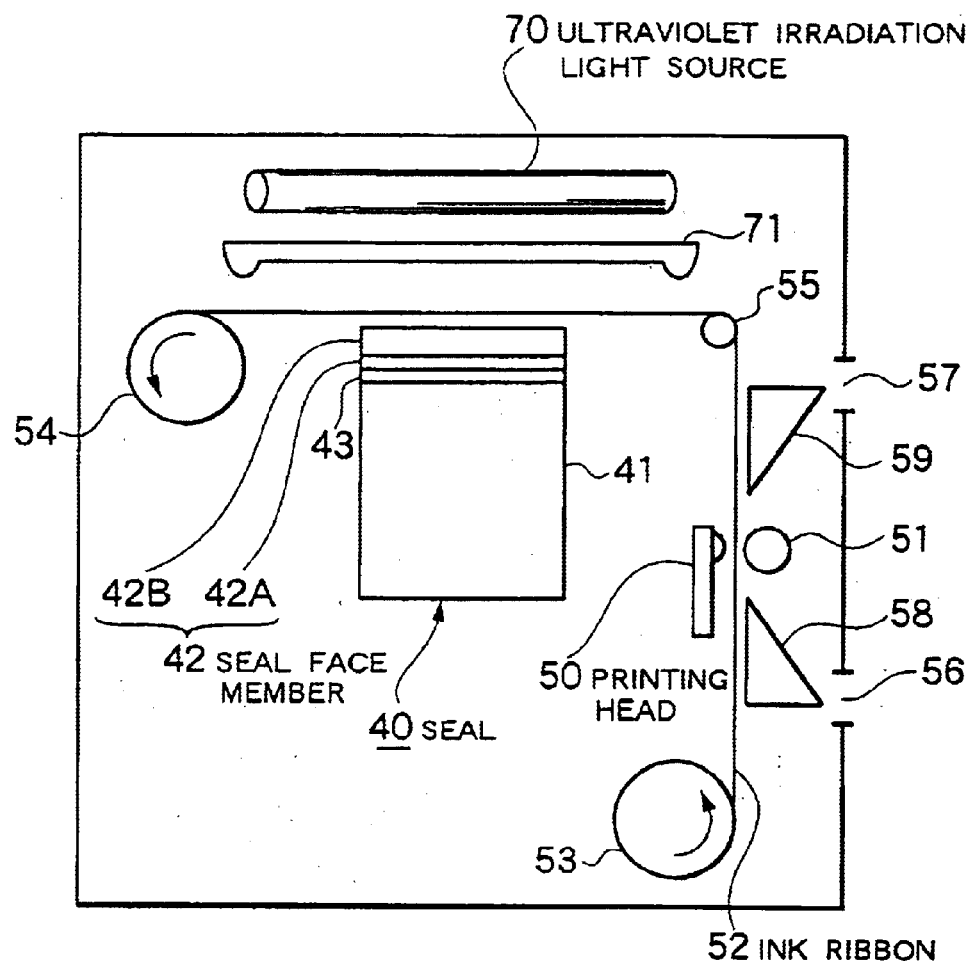
FIG. 3 is a view showing the arrangement of mechanical-optical members in a seal producing apparatus according to an embodiment of the present invention.

The seal producing apparatus of the present invention roughly includes electrical members (including an information processing unit and an imprint transfer control unit) shown in FIG. 2, and mechanical-optical members (including a printing unit and a light irradiation unit) shown in FIG. 3. FIG. 3 also shows the configuration of a seal itself.

Referring to the block diagram in FIG. 2, the electrical members in this embodiment will be described.

The electrical members are adapted mainly to introduce imprint pattern information so as to control the mechanical-optical members, and categorized into a type of information processor. The electrical members roughly include an input unit 10, a control unit 20 and an output unit 30, as in the other information processors. The control unit 20 is adapted to execute processing in accordance with information supplied from the input unit 10 and a processing stage at that time, and to control the mechanical-optical members via the output unit 30 based on the result of the processing, etc.

The input unit 10 includes a key input unit 11, a switch 12 for switching the state of the apparatus, and various types of detection sensors 13.

The switch 12 is constituted by, for example, a dial switch, and is adapted to instruct turning-on and turning-off of the electric power, starting exposure to the seal (the seal face member) and opening a cover member provided at a space for accommodating the seal. As the detection sensors, a sensor for detecting attachment of an ink ribbon, and a sensor for detecting attachment and position of plate-making sheet as later described can be mentioned.

The key input unit 11 roughly includes a character key section constituted by a selection dial or character key adapted to generate general operation signals for character input, and a function key section adapted to generate operation signals associated with functions other than character input and specific operation signals for character input, such as deletion of input characters, input of symbol characters, etc.

The output unit 30 includes mechanical-optical-member driving circuits 31 for driving and controlling each of the mechanical-optical members as later described, and display driving circuits 32 for driving the display unit 33. The driving circuits 31 and 32 are adapted to drive their associated units under the control of the control unit 20.

The display unit 33 includes a liquid crystal display capable of displaying, for example, six characters, and a plurality of indicators arranged around the liquid crystal display. The liquid crystal display is adapted display a guidance message for the user, and a character string input by the user. At the portions on the surface of the apparatus associated with the respective indicators, characters representing the attributes or states (for example, character size, character type, etc.) allocated to the respective indicators are printed. The current attributes or states are shown by lighting-on, lighting-off or blinking of the associated indicators.

Note that the mechanical-optical-member driving circuits 31 actually includes various driving circuits, but are shown in a block in the drawing. The mechanical-optical members includes various members which must be controlled as described later, and actually driving circuits are provided for the respective members to be controlled.

The control unit 20 is constituted by, for example, a microcomputer. The control unit 20 includes a CPU 21, a ROM 22, a RAM 23, a character generator ROM (CG- ROM) 24, an input interface 25 and an output interface 26 that are connected via system bus 27.

The ROM 22 stores various types of processing programs used for producing a seal to be executed by the CPU 21, including fixed phrase seal producing program 22a (see FIG. 1), and fixed data, such as dictionary data for kana-kanji conversion. In this embodiment, the fixed data include a fixed phrase data 22b (see FIG. 8).

The RAM 23 is used as a working memory by the CPU 21 and adapted to store fixed data associated with user input. The RAM 23 is backed up even while the electric power is turned off. Note that, although in FIG. 2 the RAM 23 is constituted as an internal RAM, the RAM 23 may be constituted as a combination of such an internal RAM and an add-on RAM. Further, part of functions of the RAM 23 maybe served by a rewritable non-volatile memory, such as EEPROM, etc.

In this embodiment, in the RAM 23, there is provided, in addition to a text area 23a and a display buffer 23b, a print buffer 23c.

The CG-ROM 24 is adapted to store dot patterns (font information) of the letters and symbols provided in the seal producing apparatus and to output, when code data for specifying a letter or symbol are supplied, dot patterns corresponding thereto. Note that, in this embodiment, the CG-ROM 24 stores dot patterns used for only fixed phrases, which are not accessed in the ordinary character input state.

The input interface 25 is adapted interface between the input unit 10 and the control unit 20. The output interface 26 is adapted to interface between the output unit 30 and the control unit 20.

The CPU 21 is adapted to execute a processing program stored in the ROM 22 that is determined in accordance with an input signal sent from the input unit 10 and a processing stage at that time while utilizing the RAM 23 as a working area or, if necessary, appropriately using fixed data stored in the ROM 22 or RAM 23. Also, the CPU 21 is adapted to cause the display unit 33 to display the state or the result of the processing, or drives each of the mechanical-optical members (FIG. 3) so as to produce a seal.

Next, the configuration of the mechanical-optical members and the seal will be described with reference to FIG. 3.

The seal 40 includes a base member 41, a sponge member 43 attached on one surface of the base member 41 for enhancing contact between the convex portions of the seal face member and a sheet, and a planar seal face member 42. The seal face member 42 includes a base layer 42A insensitive to ultraviolet light, and an ultraviolet-setting-resin layer 42B exposing to the outside. In the ultraviolet-setting-resin layer 42B, portions other than the set portion can be removed with a specific liquid (for example, water). Note that the seal 40 has a physical identification element, such as a hole, which enables a seal type detection sensor (denoted by reference numeral 13 in FIG. 2) to detect a seal type of the seal loaded in the seal producing apparatus.

The mechanical-optical members shown in FIG. 3 roughly include a printing structure and an ultraviolet irradiation structure.

The printing structure employs a thermal transfer method and includes a printing head 50 of a fixed type, a platen roller 51, an ink ribbon 52, a feeding reel 53, a winding reel 54, a roller 55 for switching the proceeding direction of the ink ribbon 52. The printing structure further includes an insertion hole 56 for inserting a plate-making sheet (see FIG. 4), a discharging hole 57 for discharging the plate-making sheet, a guide member 58 for guiding the plate-making sheet inserted from the insertion hole 56 to a printing position, and a separation structure 59 for separating the plate-making sheet from the ink ribbon 52, both fed from the printing position, so as to guide the plate-making sheet thus separated to the discharging hole 57.

Figure 4A:
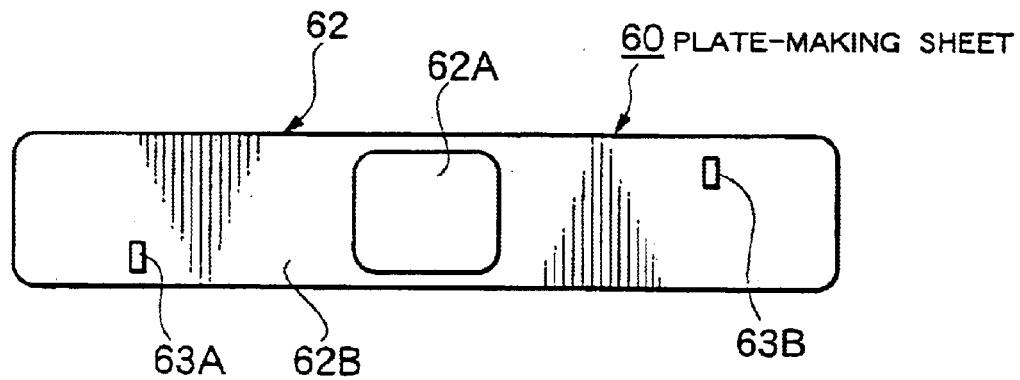
FIGS. 4A and 4B are views showing an arrangement of a plate-making sheet according to an embodiment of the present invention.
Figure 4B:
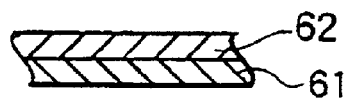

As shown in FIGS. 4A and 4B illustrating a plate-making sheet 60 used for a rectangular seal, the plate-making sheet 60 includes a sheet body 62 having a rear surface coated with an adhesive agent, and a peelable paper 61 adhered to the rear surface of the sheet body 62. The plate-making sheet 60 has the same size irrespective of seal types of the seal. The sheet 60 has holes 63A and 63B provided symmetrically with respect to the center of the sheet and adapted to indicate a print starting position. The sheet body 62 is divided into a portion 62A having the same shape as the contour of the seal face member, which depends on the seal type of the seal, and a portion 62B other than the portion 62A. Portions 62A and 62B can be separated from each other by half cut, whereby only the portion 62A can be peeled separately. The term "half cut" as used herein refers to the state of the sheet in which only the sheet body 62 is formed with a slit dividing the portion 63A and 63B while the peelable paper 61 is continuous, that is, not formed with such a slit.

When the plate-making sheet 60 is inserted into the insertion hole 56, the edge portion of the plate-making sheet 60 and the ribbon 52 are superposed and placed at the printing position between the printing head 50 and the platen roller 51.

The printing head 50 is adapted to transfer ink of the ink ribbon to the plate-making sheet 60 by generating heat when the heat generation driving circuit (see reference numeral 31 in FIG. 2) is activated under the control of the control unit 20. In the ink ribbon 52 of the thermal transfer method, the transferred portion loses ink and becomes transparent.

That is, the ink ribbon 52 obtained after transferring operation includes a portion which allows ultraviolet light to pass through (a portion from which ink is removed) and a portion which hinders ultraviolet light from passing through (a portion where ink remains). Accordingly, the ink ribbon obtained after the transferring operation, namely, the ink ribbon in which printing of an imprint pattern and consequently transparent portions corresponding to the imprint pattern is formed, is used as a negative film. As described above, the sheet on which printing is executed is used for preparing a negative film, and accordingly the sheet is referred to as "plate-making sheet", and executing printing is referred to as "plate making" in this specification.

In the plate making process, the ink ribbon 52 and the plate-making sheet superposed each other after passing the printing section consisting of the printing head 50 and a platen roller 51 are conveyed by the action of the platen roller 51 to reach the separation structure 59, whereby the ink ribbon 52 and the plate-making sheet 60 are separated.

The separated plate-making sheet 60 is fed to the discharging hole 57. On the other hand, the separated ink ribbon 52 is adapted to stop at the position opposite to the ultraviolet-setting-resin layer 42B of the seal 40. The ink ribbon 52 thus fed during the plate-making operation is adapted to be wound around the winding reel 54.

After the plate-making sheet 60 is discharged from the discharging hole 57, the printed portion 62A thereof is peeled off and attached to the top surface of the seal 40 to help the user recognize the imprint pattern formed on the seal face member of the seal 40.

As the ultraviolet light irradiating structure, an ultraviolet irradiation light source (having, for example, a paraboloidal surface mirror) 70 is fixedly provided. Turning on and off of the light source 70 is controlled by the control unit 20. Also, a transparent plate 71, which is moved forward and backward, is provided opposite to the ultraviolet-setting-resin layer 42B of the seal face member 42 with the ribbon 52 (negative film portion) positioned therebetween. That is, ultraviolet light emitted from the ultraviolet irradiation light source 70 reaches the ultraviolet-setting-resin layer 42B via the transparent plate 71 and the ink ribbon 52.

The transparent plate 71 is adapted to enhance the degree of contact between the ink ribbon 52 serving as a negative film and the ultraviolet-setting-resin layer 42B when situated at the forward movement position (a position taken when the switch 12 designates activation of exposure), and not to obstacle the proceeding of the ink ribbon 52 when situated at the backward position.

Note that the positional relationship between the combination of the ultraviolet irradiation light source 70 and the transparent plate 71 and the seal 40 with the ink ribbon 52 (negative film portion) interposed therebetwen is not limited to that shown in FIG. 3. As another positional relationship, the seal 40 is provided above the ink ribbon 52 while the combination of the ultraviolet irradiation light source 70 and the transparent plate 71 below the ink ribbon 52 with reference to FIG. 3.

(B) General Procedure for Producing Seal According to the Embodiment

Next, a general procedure which is executed by the user for producing a seal with the seal producing apparatus of this embodiment will be described.

The user loads the seal 40 on which no imprint pattern is formed, and then turns on the electric power by operating the switch 12, and then inputs imprint pattern information (a character string) by operating various keys of the key input unit 11. Input of the imprint pattern information includes, as well as input of the character string constituting the imprint image, input of various attributes of the characters, such as styles of the characters, vertical writing vs. lateral writing, and character sizes.

After completing the input of an imprint pattern information, the user executes preview to verify whether or not the imprint image thus displayed is his desired one. The user, after confirming that the imprint image is his desired one though the preview, inserts the plate-making sheet 60 into the insertion hole 56 as far as the sheet 60 proceeds. Thereafter, the user executes a plate-making process by operating a plate-making key in the key input unit 11, thereby forming a negative film portion in the ink ribbon 52. When the plate-making key is operated, the CPU 21 develops the input character string on the printing buffer in the RAM 23 in accordance with attributes associated with the character string. Thereafter, the CPU 21 drives the printing head 50 and the platen roller 51 to execute printing so as to prepare a negative film, which is conveyed to the position opposite to the seal face member 42.

After completing the plate-making process, the user instructs exposure by operating the switch 12. In response to this instruction, the CPU 21 activates the ultraviolet irradiation light source 70 to irradiate ultraviolet light onto the seal face member 42. After elapse of a predetermined time of irradiation, the CPU 21 causes an exposure completion message to be displayed and concurrently stops irradiation of the ultraviolet light emitted from the ultraviolet light irradiating source 70. Thereby, in the ultraviolet-setting-resin layer 42B of the seal face member 42, the portions corresponding to the imprint pattern are set.

After completing exposure, the user operates the switch 12 to instruct opening the cover member 65, and takes out the seal 40 obtained after exposure. Thereafter, the user soaks the seal face member 42 of the seal 40 in a specific liquid (for example, water) put in a vessel, the bottom of which is provided with abrush. Then the user moves the seal 40 reciprocatingly to wash the seal face member 42 so as to remove the portion not set, thereby forming unevenness on the seal face member 42, whereby the seal is produced.

(C) Fixed Phrase Processing

Figure 1:
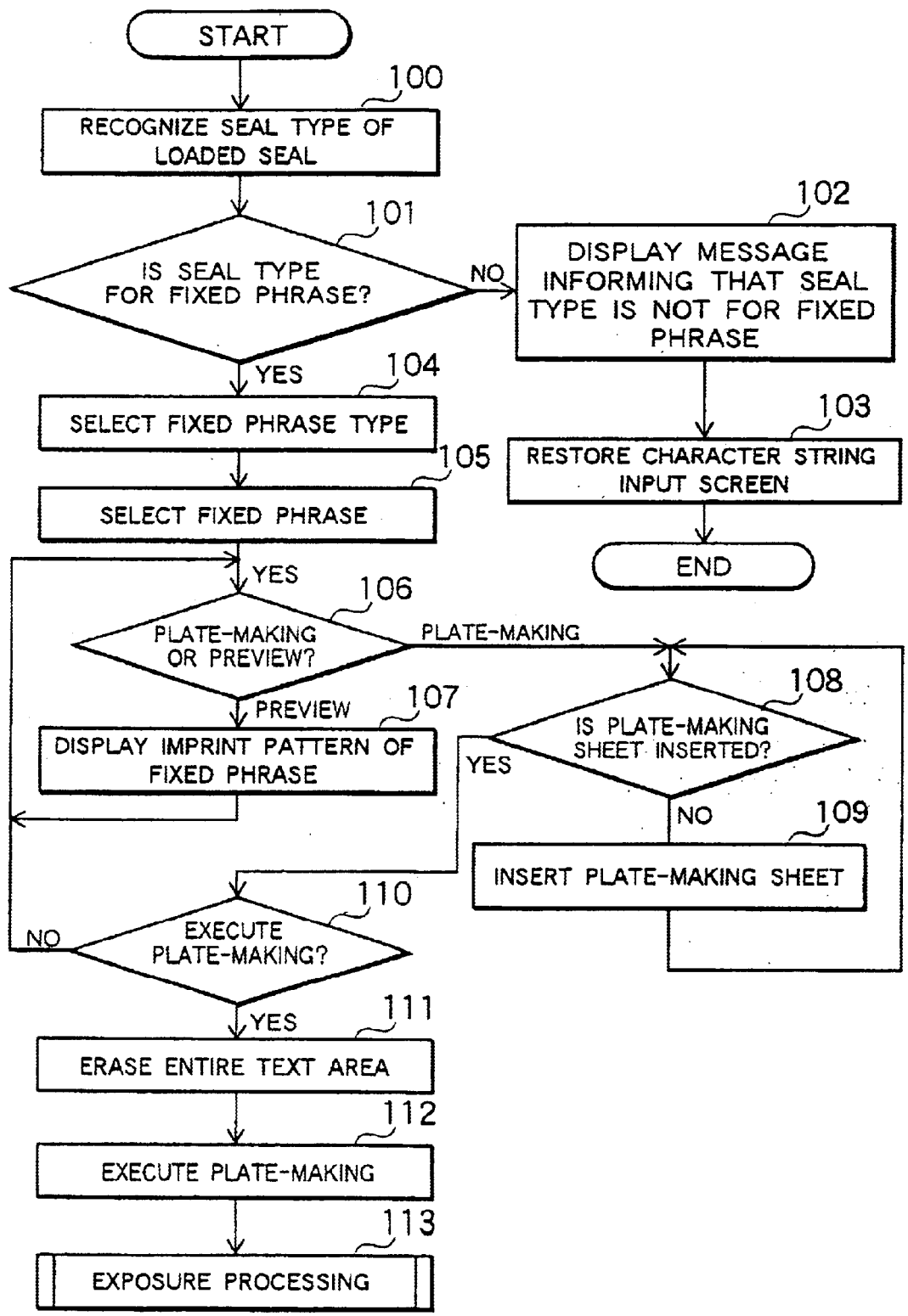
FIG. 1 is a flowchart showing the fixed phrase seal producing processing according to an embodiment of the present invention.

One of the characteristic features of the seal producing apparatus according to the preferred embodiment of the present invention is that a function of producing a seal having a seal face member on which a fixed phrase is engraved without inputting a character string nor designating printing attributes. Hereinafter, seal having a seal face member on which a fixed phrase is engraved is often referred to as "fixed phrase seal", the function of producing a fixed phrase seal is often referred as "fixed phrase seal producing function", and the processing of producing a fixed phrase seal is often referred to as "fixed phrase seal producing processing". The fixed phrase seal producing processing is realized as the series of the operations of the fixed seal producing program 22a whose flowchart is shown in FIG. 1.

Hereinafter, the fixed phrase seal producing processing will be detailed with reference to the flowchart in FIG. 1.

As shown in the flowchart, when a fixed phrase seal producing mode (that is, a mode in which the fixed phrase seal producing processing is performed) is designated by operating a fixed phrase seal producing key provided in the key input unit 11, or by selecting a fixed phrase seal producing option from a menu, the CPU 21 starts the fixed phrase seal producing processing in accordance with the program 22a.

On entering the fixed phrase seal producing processing, the CPU 21 first recognizes the seal type of the seal loaded in the apparatus (step 100), and then judges whether or not the seal type is included in the seal types which the apparatus deals with (step 101).

In the present embodiment, as shown in FIG. 5, the seal types which the apparatus deals with are "private seal (small size)", "private seal", "rectangular seal (small size)", "rectangular seal (medium size)", "accounting seal", "name seal", "business seal (small size)", "business seal (large size)" and "address seal". Here, a "private seal" is a seal which has, in general, a circular shape and on which a family name is engraved. In contrast, a "name seal", which appears later in this specification, is a seal which has a rectangular shape and on which a first name and a family name are engraved.

Of the above-mentioned seal types, "private seal (small size)", "private seal", "rectangular seal (small size)", "rectangular seal (medium size)" are common in that the lengthwise and widthwise dimensions of the contour of the seal face member are almost the same. The difference between these seal types lies in that the former two seal types are almost circular-shaped and the latter two seal types are almost square-shaped. With respect to the size of the seal face member, these seal types are put in the smaller-to-larger order of "private seal (small size)", "private seal" and "rectangular seal (small size)", and "rectangular seal (medium size)". Hereinafter, these seal types are categorized as "square-shaped seal-type group".

By contrast, "accounting seal", "name seal", "business seal (small size)", "business seal (large size)" and "address seal" are common in that the contour of the seal face member has a rectangular shape in which one of the lengthwise and widthwise dimensions is considerably larger than the other. With respect to the size of the seal face member, these seal types are put in the smaller-to-larger order of "accounting seal", "name seal", "business seal (small size)", "business seal (large size)", and "address seal". Hereinafter, these seal types are categorized as "rectangular-shaped seal-type group".

In the present embodiment, as shown in FIG. 5, the seal types of "private seal (small size)", "accounting seal" and "name seal" are not treated, by the seal producing apparatus of the present embodiment, as the objective of fixed phrase seal producing processing, that is, seals belonging to the "private seal (small size)", "accounting seal" and "name seal" are not allowed to be made into a fixed phrase seal by using the seal producing apparatus of the present embodiment.

By contrast, the other seal types, that is, "private seal", "rectangular seal (small size)", "rectangular seal (medium size)", "business seal (small size)", "business seal (small size)" and "address seal" are treated, by the seal producing apparatus of the present embodiment as an objective of the fixed phrase seal producing processing, that is, seals belonging to "private seal", "rectangular seal (small size)", "rectangular seal (medium size)", "business seal (small size)", "business seal (large size)" and "address seal" are allowed to be made into a fixed phrase seal by using the seal producing apparatus of the present embodiment (hereinafter, a seal type treated as an objective of the fixed phrase seal producing processing will be often referred to as "fixed-phrase-seal-producing-processing objective seal type").

Note that, in the table of FIG. 5, the symbol "Y" shows that the seal type denoted by this symbol is the fixed-phrase-seal-producing-processing objective seal type, while the symbol "N" shows that the seal type denoted this symbol is not the fixed-phrase-seal-producing-processing objective seal type.

When it is judged at step 101 that the loaded seal does not belong to "fixed-phrase-seal-producing-processing objective seal type", the CPU 21 causes the display unit 33 to display, for a predetermined period of time, a message informing the user that the seal type of the loaded seal is not an allowed one (step 102), and restores the character string input screen, which was taken before the fixed phrase seal producing processing is started, thus completing the fixed phrase seal producing processing (step 103). Note that the change of display from the message informing that the seal type of the loaded seal is not allowed one to the character string input screen may be performed by operating any one of the keys.

By contrast, when it is judged at step 101 that the loaded seal belongs to "fixed-phrase-seal-producing-processing objective seal type", the CPU 21 urges the user to select one of the types of fixed phrase (hereinafter, a type of a fixed phrase will be referred to as "fixed phrase type"), which is previously stored in the apparatus in association with the seal type of the loaded seal (step 104).

In the case of the present embodiment, as shown in FIG. 5, as the fixed phrase type, there are "のし紙", which is a fixed phrase type suitable for being printed on a gift wrapping paper; "お正月", which is a fixed phrase type related to new year's day; and "郵紙", which is a fixed phrase type related to mail.

As to the seal types of "private seal", "rectangular seal (small size)" and "rectangular seal (medium size)", the fixed phrase types of "のし紙" and "郵紙" are provided, but the fixed phrase type of "お正月" is not provided. Therefore, when the loaded seal belongs to any one of the seal types of "private seal", "rectangular seal. (small size)" and "rectangular seal (medium size)", the apparatus urges the user to select a fixed phrase type out of "のし紙" and "郵紙".

By contrast, as to the other seal types, that is, as to "business seal (small size)", "business seal (large size)" and "address seal", all the fixed phrase types of "のし紙", "郵紙" and "お正月" are provided. Therefore, when the loaded seal belongs to any one of the seal types of "business seal (small size)", "business seal (large size)" and "address seal", the apparatus urges the user to select a fixed phrase type out of "のし紙", のし紙"郵紙" and "お正月". It is preferred that a fixed phrase type to be presented by the apparatus as an initial eligible fixed phrase for selection is determined, in principle, to a fixed phrase type which was accessed last time (that is, a fixed phrase type which was selected immediately before the current operation), regardless of the seal type of the loaded seal.

After the fixed phrase type is selected, the CPU 21 urges the user to select one of the fixed phrases which belong to the selected fixed phrase type (step 105).

Figures 8A, 8B, 9A, 9B:
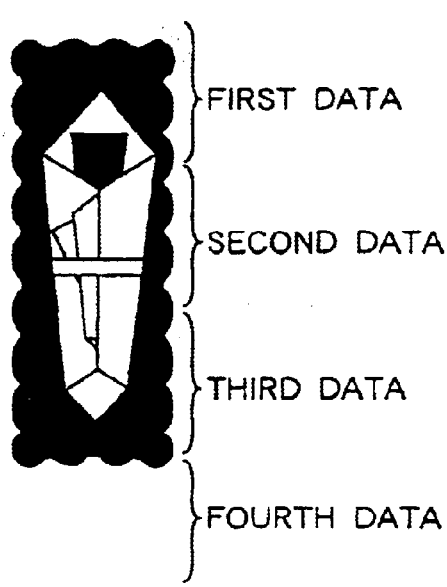
FIGS. 8A and 8B are explanatory views each showing an example of a three-data type fixed phrase in a seal producing apparatus according to an embodiment of the present invention.
FIGS. 9A and 9B are explanatory views each showing an example of a three plus α-data type fixed phrase in a seal producing apparatus according to an embodiment of the present invention.

In this embodiment, the fixed phrases provided as to the fixed phrase type of "のし紙" are as follows: fixed phrases each of which is composed of one character, such as "壽" (meaning "congratulations", which is usually labeled on a gift given on an auspicious occasion, such as a wedding ceremony), "贈" (meaning "present", which is usually labeled on a present given at a presentation ceremony), "志" (meaning "gift as a token of one's gratitude"), etc. (hereinafter a fixed phrase composed of one character will be often referred to as "one-data type fixed phrase" or simply as "one-data type"), as shown in FIGS. 6A to 6C; fixed phrases each of which is composed of two characters, such as "御礼" (meaning "gift as a token of one's appreciation"), "寸志" (meaning "gift as a small token of one's gratitude"), "内祝" (meaning "gift given on the occasion of a family celebration"), etc. (hereinafter, a fixed phrase composed of two characters will be often referred to as "two-data type fixed phrase" or simply as "two-data type"), as shown in FIGS. 7A to 7C; fixed phrases each of which is composed of three characters, such as "お年玉" (note that "お年玉" is also provided as a fixed phrase which belongs to the fixed phrase type of "お正月"), "御霊前" (meaning "before the spirit of the deceased", which is labeled on paper wrapping an article or money offered on the altar at the funeral of the deceased), etc. (hereinafter a fixed phrase composed of three characters will be often referred to as "three-data type fixed phrase" or simply as "three-data type"), as shown in FIGS. 8A and 8B; and fixed phrases each of which occupies an area corresponding to more than three characters but less than four characters, such as the figures as shown in FIGS. 9A and 9B (hereinafter, a fixed phrase which occupies an area corresponding to more than three characters but less than four characters will be often referred to as "3+α-data type fixed phrase" or simply as "3+α-data type"). Note that, although such figures as shown in FIGS. 9A and 9B do not fall within the ordinary concept of "fixed phrase", they are treated as one of fixed phrases in the present embodiment.

As to the fixed phrase type of "お正月", two-data type fixed phrases, three-data type fixed phrases, and 3+α-data type fixed phrases are provided, but no one-data type fixed phrase is provided.

As to the fixed phrase type of "郵紙", one-data type fixed phrases, two-data type fixed phrases, three-data type fixed phrases, and 3+α-data type fixed phrases are provided.

Figure 10:
FIG. 10 is an explanatory view showing how a fixed phrase containing four or more characters in the seal producing apparatus according to an embodiment of the present invention.

Note that, as to fixed phrases each of which is composed of four or more characters, such as "謹賀新年" (meaning "A Happy -New Year") (which belongs to the fixed phrase type of "お正月") and "AIR MAIL" (which belongs to the fixed phrase type of "郵紙"),the character string of each of such fixed phrases is regarded as a figure, and each of such fixed phrases is provided as a 3+α-data type fixed phrase, as shown in FIG. 10, in which the case of "AIR MAIL" is illustrated. As is known from FIG. 10, since a fixed phrase composed of four or more characters is treated as one figure regardless of the number of characters, the fixed phrase can be treated as a 3+α-data type fixed phrase.

Further, note that, with respect to seal types which belong to "square-shaped seal-type group", there are provided only one-data type fixed phrases. Accordingly, if the seal type of the loaded seal belongs to "square-shaped seal-type group", the CPU 21 causes only one-data type fixed phrases to be displayed as eligible fixed phrases for selection, and urges the user to select his desired fixed phrase out of the eligible one-data type fixed phrases thus displayed.

After a fixed phrase is selected in the above-described way, the CPU 21 causes the display unit 33 to display a message asking the user which option, an option of printing the selected fixed phrase on the seal or an option of displaying a preview screen of the selected fixed phrase, the user wishes to select, and judges which option is selected (step 106).

When it is judged at step 106 that the option of causing the preview screen to be displayed is selected, the CPU 21 causes the display unit 33 to display the imprint pattern of the selected fixed phrase (step 107). Thereafter, after a predetermined period of time is elapsed, or when any one of the keys is operated, the CPU 21 returns to step 106. Note that, while the preview screen is being displayed, no access is made to the text area 23*a*.

More particularly, the CPU 21 takes out code data string of the selected fixed phrase from the fixed phrase data 22*b* in the ROM 22 on the basis of the identification information of the selected fixed phrase, accesses the CG-ROM 24 by means of the respective code data constituting the code data string to take out the dot pattern therefrom, and then causes the display buffer 23*b* to develop the dot pattern thus taken out, thus causing the display unit 33 to display the imprint pattern of the selected fixed phrase. Developing the dot pattern at the display buffer 23*b* is performed in accordance with a developing method which is determined by the data type regulated by the number of data in the code data string, the seal type of the loaded seal, and the vertical or horizontal writing information accompanying the code data string. More particularly, the margins, the arrangement of the dot pattern, and the enlarging or reducing multiplicity of the dot pattern is predetermined in accordance with the data type and the seal type of the loaded seal, and also vertical or lateral writing accompanies the code data string.

Note that, if the number of data in the code data string is one, the code data string is developed in accordance with the developing method for one-data type; if the number of data in the code data string is two, the coded data string is developed in accordance with the developing method for two-data type; if the number of data in the code data string is three, the code data string is developed in accordance with the developing method for three-data type; and if the number of data in the code data string is four, the code data string is developed in accordance with the developing method for 3+α-data type.

As described above, in the fixed phrase processing according to the present embodiment, with respect to data of fixed phrase (hereinafter, data of a fixed phrase will be often referred to as "fixed phrase data"), it is almost unnecessary to determine printing attributes in connection with the data of the respective characters constituting the fixed phrase character string and in connection with the data of the entire character string, that is, the only printing attribute to be determined is vertical or lateral writing (Note that the determination of the vertical or lateral writing is automatically performed by the apparatus, not by the user.). Also, the size and arrangement of the fixed phrase data are determined by the data type and seal type. As a result, data amount of the fixed phrase data can be determined to the minimum amount. Further, at the time of the development, it becomes unnecessary to perform processing of converting a character size designated in the form of a relative value to a character size designated in the form of an absolute value, and processing of calculating the character pitch, so that the development of the data can be performed at a high speed.

Figure 11A:
FIG. 11A and 11B are explanatory views each showing a fixed phrase containing an enclosure in a seal producing apparatus according to an embodiment of the present invention.

For example, in the case of the fixed phrase consisting of a character "緘" and a circular enclosing pattern surrounding the character as shown in FIG. 11A, dot pattern of the circular enclosing pattern is contained as a part of the dot pattern corresponding to the code data of the fixed phrase of the encircled character "緘". That is, the fixed phrase shown in FIG. 11A is developed in the form of one dot pattern. In other words, the circular enclosing pattern is not treated as a separate enclosing pattern from the character "緘". Thereby, the developing operation can be performed at a high speed and at an easy manner. Here, the fixed phrase consisting of a character "緘" and its circular enclosing pattern as shown in FIG. 11A means "firmly sealed", which is usually stamped at the sealed portion of an envelop enclosing a formal document.

Figure 11B:

Also in the case of the enclosure pattern of the fixed phrase "速達" as shown in FIG. 11B, the characters and its enclosing pattern are treated integrally at the time of development, similarly to the case of the fixed phrase consisting of a character "緘" and its circular enclosing pattern shown in FIG. 11A.

Note that, in the present embodiment, displaying an imprint pattern for allowing the user to confirm the imprint pattern is referred to as "preview", not the usually employed term "layout display", for the following reason. In the case of "layout display", displaying an imprint pattern is performed for allowing the user to verify the appropriateness of the printing attributes thereof, such as character size, character pitch, and so on, and for allowing, if necessary, him to alter the printing attributes. In contrast, in the case of displaying an imprint pattern of a fixed phrase in the present embodiment, displaying an imprint pattern is performed only for allowing the user to verify whether or not the displayed imprint pattern is his desired one. Thus, in the process of displaying an imprint pattern of a fixed phrase in the present embodiment, it is not intended to verify printing attributes, such as character size, character pitch, and so on. Therefore, displaying an imprint pattern of a fixed phrase according to the present embodiment is expressed by the term "preview ", not by the term "layout display".

By contrast, when it is judged at step 106 that performing plate-making processing is selected, the CPU 21 verifies whether or not the plate-making sheet 60 is inserted from the insertion hole 56 (step 108) If it is judged at step 108 that the plate-making sheet 60 is not inserted, the CPU 21 causes the display unit 33 to display a message urging the user to insert the plate-making sheet 60, and awaits insertion of the plate-making sheet 60 (step 109).

When it is judged at step 108 that the plate-making sheet is inserted, the CPU 21 causes the display unit 33 to display, for finally-confirming the user's intention, a message inquiring the user of whether he wishes to perform plate-making processing (step 110).

If performing the plate-making processing is cancelled, for example, by operating the cancellation key, the CPU 21 returns to the above-described step 106.

By contrast, when it is judged at step 106 that performing the plate-making processing is designated, the CPU 21 erases all the character string in the text area 23a (step 111). Thereafter, the CPU 21 causes the printing buffer 23c to develop the dot pattern of the imprint pattern of the selected fixed phrase. Thereafter, the CPU 21 causes the printing head 50 to operate while supplying the dot pattern thus developed to the printing head 50. Concurrently, the CPU 21 activates the platen roller 51 to cause the plate-making sheet 60 and the ink ribbon 52 to proceed, whereby printing on the plate-making sheet is performed so as to form a negative film portion in the ribbon 52 (that is, plate-making processing is performed). Thereafter, the negative film portion is moved to a position opposite to the place where the seal face member 42 is provided (step 112).

Note that the method of developing the imprint pattern of the fixed phrase on the printing buffer is the same as the method of developing the print pattern on the display buffer 23b performed at the preview processing. That is, the development at the printing buffer 23c is performed in accordance with the developing method determined by the data type regulated by the number of data in the code data string of the selected fixed phrase, the seal type of the loaded seal, and a vertical or lateral writing property accompanying the code data string.

In the present embodiment, the exposure processing (step 113) performed after the plate-making processing, which is composed of displaying a message urging the user to execute exposure processing and performing the actual exposure processing, is performed in the same way as in conventional apparatuses. In other words, the exposure processing performed after the plate-making processing with respect to a fixed phrase is the same as that performed after the plate-making processing with respect to an optionally input character string. For this reason, the explanation of the exposure processing is omitted.

Note that, when the character string input screen, which is restored after the plate-making processing and the subsequent exposure processing, contains no character string because all the character string in the text area 23a is already erased.

(D) Advantages of the Embodiment

As described above, according to the above-described embodiment, since data of a fixed phrase, which consists of only fixed character string determined regardless of the user, is previously stored in the apparatus, a seal having a seal face on which an imprint pattern of the fixed phrase can be obtained through a relatively simple and easy processings, that is, only by performing the plate-making processing and exposure processing.

Further, neither altering the character string of the selected fixed phrase nor altering the printing attribute associated with the character string is allowed, the imprint pattern engraved on the seal face member of the seal is well proportioned and balanced as a fixed phrase seal.

Further, according to the developing method of developing the fixed phrase data which is previously stored in the apparatus according to the present embodiment, most of the printing attributes of the fixed phrase data are fixed, that is, not altered or modified. Owing to this constitution, developing the fixed phrase data is performed readily and swiftly compared with the case where an optionally input character string is developed, and also the storage area for the printing attributes of the fixed data can be minimized.

(E) Other embodiments

While in the explanation of the above-described embodiment, modification and alteration of the embodiment and the other embodiments are appropriately mentioned, still other embodiments will be described.

As to fixed phrase types, "のし紙", "お正月" and "郵紙" are provided in the above-mentioned embodiment, but fixed phrase types are not limited thereto. For example, accounting items related to accounting seal, which are regarded as not falling in the concept of fixed phrase in an ordinary sense, may be provided as fixed phrase types.

Further, in the above-mentioned embodiment, with respect to the same character, two types of dot patterns are provided: one for a fixed phrase, the other for an ordinarily input character. However, with respect to some characters, the same dot pattern may be used both for a fixed phrase and for an ordinarily input character.

Further, in the above-mentioned embodiment, the printing attributes are fixedly determined by the seal type of the loaded seal and the selected fixed phrase, that is, the printing attributes cannot be altered. However, the apparatus may be configured in such a manner that part of printing attributes can be modified according to fixed phrase types. For example, the apparatus may be configured in such a manner that, with respect to fixed phrases, such as "回覧" (meaning "circular notice") and "至急" (meaning "urgent"), selection between vertical writing and lateral writing is allowed.

Further, in the above-mentioned embodiment, the seal is of the type that unevenness is formed on the surface of the seal face member of the seal, but the present invention can be applied to a seal producing apparatus employing the perforation method, in which ink oozes from perforations (small holes) arranged in the form of an imprint pattern to print the imprint pattern.

Further, although in the above-mentioned embodiment, the technological thought of the fixed phrase printing function is applied to a seal producing apparatus, this technological thought can be applied, not to mention, to a tape printing apparatus used for producing a label.

(F) Advantages of the Invention

According to the present invention, the character information processor includes: print medium detecting means for detecting a type of print medium which is currently loaded in the character information processor; fixed phrase information storing means for storing information used for printing a fixed phrase designated out of a plurality of fixed phrases; fixed phrase selecting means for causing the user to designate the fixed phrase to be printed; and printing means for printing, on the print medium currently loaded in the character information processor, the fixed phrase thus designated in accordance with a printing attribute determined by the type of the print medium detected by the print medium type detecting means and the information stored in the fixed phrase information storage means. Owing to this constitution, fixed phrase can be printed on a print medium through easy operations.

It should be noted that, since the present invention is not limited to the above-described embodiments and modifications, the scope of the invention is to be determined solely by the appended claims.

What is claimed is:

1. A character information processor which is adapted to print an input character string in accordance with a designated printing attribute on a print medium in which limitation is imposed on at least one of the transversal or longitudinal directions and wherein the print medium is a seal or stamp having (a) a physical development element identifying the type of seal or stamp and (b) a light sensitive layer which can be developed into a raised image, said character information processor comprising:

print medium detecting means for detecting a type of print medium which is currently loaded in said character information processor by sensing the physical identification element;

fixed phrase information storing means for storing information used for printing a fixed phrase designated out of a plurality of fixed phrases;

fixed phrase selecting means for causing the user to designate the fixed phrase to be printed; and printing means for printing, on the print medium currently loaded in said character information processor, the designated fixed phrase as the entire print image with a printing attribute determined by the type of the print medium detected by the print medium type detecting means and the information stored in the fixed phrase information storage means, said printing means includes means to expose the light sensitive layer to an image of the fixed phrase to enable the image to be developed.

2. The character information processor according to claim 1, wherein said fixed phrase information storage means comprises:

first storage section for storing fixed phrase identification information and code data string with respect to the fixed phrase;

second storage section for storing font information corresponding to code data of each fixed phrase; and third storage section for storing development method information as to development on the print buffer provided in the printing means, the development method being determined by a combination of a type of the print medium and a number of data contained in the code data string of the fixed phrase, and said printing means performs development on the print buffer with reference to the information in said first to third sections.

* * * * *